United States Patent [19]

Lui et al.

[11] Patent Number: 5,379,417

[45] Date of Patent: Jan. 3, 1995

[54] SYSTEM AND METHOD FOR ENSURING WRITE DATA INTEGRITY IN A REDUNDANT ARRAY DATA STORAGE SYSTEM

[75] Inventors: Albert Lui, San Jose; Mark S. Walker, Los Gatos, both of Calif.

[73] Assignee: Tandem Computers Incorporated, Cupertino, Calif.

[21] Appl. No.: 797,470

[22] Filed: Nov. 25, 1991

[51] Int. Cl.$^6$ .................. G06F 11/20; G06F 11/18
[52] U.S. Cl. .................. 395/575; 371/91; 371/101
[58] Field of Search ............ 395/575; 371/7, 8.1, 371/8.2, 9.1, 10.1, 11.1, 11.3

[56] References Cited

U.S. PATENT DOCUMENTS

| | | | |
|---|---|---|---|
| 3,893,178 | 7/1975 | Sordello | 360/73 |
| 4,092,732 | 5/1978 | Ouchi | 395/575 |
| 4,467,421 | 8/1984 | White | 395/425 |
| 4,562,576 | 12/1985 | Ratcliffe | 371/11.1 |
| 4,667,326 | 5/1987 | Young et al. | 371/39.1 |
| 4,722,085 | 1/1988 | Flora et al. | 371/40.1 |
| 4,754,397 | 6/1988 | Varaiya et al. | 361/685 |
| 4,761,785 | 8/1988 | Clark et al. | 371/22 |
| 4,768,193 | 8/1988 | Takemae | 371/10.3 |
| 4,775,978 | 10/1988 | Hartness | 371/40.1 |
| 4,817,035 | 3/1989 | Timsit | 395/425 |
| 4,849,929 | 3/1989 | Timsit | 395/575 |
| 4,870,643 | 9/1989 | Bultman et al. | 371/11.1 |
| 4,899,342 | 2/1990 | Potter et al. | 371/10.1 |
| 4,914,656 | 4/1990 | Dunphy, Jr. et al. | 371/10.2 |
| 4,965,717 | 10/1990 | Cutts, Jr. et al. | 395/575 |
| 4,989,206 | 1/1991 | Dunphy, Jr. et al. | 371/10.1 |
| 4,993,030 | 2/1991 | Krakauer et al. | 371/40.1 |
| 5,088,081 | 2/1992 | Farr | 369/54 |
| 5,130,992 | 7/1992 | Frey, Jr. et al. | 371/10.1 |
| 5,134,619 | 7/1992 | Hensen et al. | 371/40.1 |
| 5,148,540 | 9/1992 | Beardsley et al. | 395/575 |
| 5,157,663 | 10/1992 | Major et al. | 371/9.1 |
| 5,193,154 | 3/1993 | Kitajima et al. | 395/250 |

FOREIGN PATENT DOCUMENTS

0434532A1  12/1990  European Pat. Off. .
WO9113399   9/1991  WIPO .
WO9117506  11/1991  WIPO .

OTHER PUBLICATIONS

Kirrmann, H., "Fault Tolerance in Process Control: An Overview and Examples of European Products", IEEE *Micro*, Oct. 1987, pp. 27–50.

Patterson, D. A., Gibson, G., and Katz, H.; A Case For Redundant Arrays of Inexpensive Disks (RAID).

Lee, E. K.; Software and Performance Issues in the Implementation of a RAID Prototype (May 1990).

Chen, P., Gibson, G., Katz, R. H., Patterson, D. A., and Schulze, M.; Introduction to Redundant Arrays of Inexpensive Disks (RAID) (Dec. 1988).

Chen, P., Gibson, G., Katz, R. H., Patterson, D. A., and Schulze, M., et al. Evolution of the Raid 2 Architecture (Jun. 12, 1990).

Maximum Strategy, Inc., San Jose, Calif.; Strategy 2 Disk Array Controller Operation Manual (Nov. 2, 1988).

Maximum Strategy, Inc., San Jose, Calif.; Strategy 1 Disk Array Controller Operation Manual (Date unknown).

Gibson, G. A., Performance and Reliability in Redundant Arrays of Inexpensive Disks (Date Unknown).

Chen, P., An Evaluation of Redundant Arrays of Disks Using an Amdahl 5890; (May 1989).

Katz, R. H., Gibson, G. A., and Patterson, D. A.,; Disk System Architectures for High Performance Computing (Mar. 1989).

Gray, J., Horst, B., and Walker, M.; Parity Striping of Disc Arrays: Low–Cost Reliable Storage with Acceptable Throughput (Jan. 1990).

Schultz, M. E.; Considerations in the Design of a Raid Prototype (Aug. 1988).

Clark, and Corrigan; IBM Systems Journal, vol. 23, No. 3, 1989.

Dishon, et al., "A Highly Available Storage System Using the Checksum Method", The Seventeenth Inter. Symposium on Fault-Tolerant Computing, pp. 176–181, 1987.

Ball, et al., "OLTP Systems Need To Be Fault Tolerant", Computer Technology Review, (1989) Mar., No. 3, Los Angeles, Calif.

*Primary Examiner*—Stephen M. Baker

*Attorney, Agent, or Firm*—Lawrence Granatelli

[57] ABSTRACT

A system and method for ensuring the completion and integrity of data modification operations to a redundant array data storage system and for ensuring the integrity of redundancy values in such a system. The system combines four elements: reliable host processing provided by primary and secondary CPU's with check pointing of operations, so that the secondary CPU can complete initiation of a data modification operation if the primary CPU fails; block-buffering of Write data in a host CPU adapter before transmission of the data to a RAID array controller, so that failure of the host CPU after buffering completes does not interfere with completion of the data modification operation; reliable array processing provided by primary and secondary array controllers with check pointing of operations, so that the secondary array controller can complete a data modification operation if the primary array controller fails; and battery-backup for the power supply to the array controller and the storage units comprising the storage array, or, in the alternative, non-volatile memory in the array controller sufficient to store all data modification operation command information for data records that have not been successfully written to the storage units, for use in subsequent retries.

21 Claims, 3 Drawing Sheets

SYSTEM AND METHOD FOR ENSURING WRITE DATA INTEGRITY IN A REDUNDANT ARRAY DATA STORAGE SYSTEM

BACKGROUND OF THE INVENTION

1. Field of the Invention

This invention relates to computer system data storage, and more particularly to a system and method for ensuring the completion and integrity of data modification operations to a redundant array data storage system and for ensuring the integrity of redundancy values in such a system.

2. Description of Related Art

A typical data processing system generally involves one or more storage units which are connected to a Central Processor Unit (CPU) either directly or through a control unit and a channel. The function of the storage units is to store data and programs which the CPU uses in performing particular data processing tasks.

Various types of storage units are used in current data processing systems. A typical system may include one or more large capacity tape units and/or disk drives (magnetic, optical, or semiconductor) connected to the system through respective control units for storing data.

However, a problem exists if one of the large capacity storage units fails such that information contained in that unit is no longer available to the system. Generally, such a failure will shut down the entire computer system.

The prior art has suggested several ways of solving the problem of providing reliable data storage. In systems where records are relatively small, it is possible to use error correcting codes which generate ECC syndrome bits that are appended to each data record within a storage unit. With such codes, it is possible to correct a small amount of data that may be read erroneously. However, such codes are generally not suitable for correcting or recreating long records which are in error, and provide no remedy at all if a complete storage unit fails. Therefore, a need exists for providing data reliability external to individual storage units.

One solution to this problem is disk array systems. Disk array systems are of various types. A research group at the University of California, Berkeley, in a paper entitled "A Case for Redundant Arrays of Inexpensive Disks (RAID)", Patterson, et al., Proc. ACM SIGMOD, June 1988, has catalogued a number of different types by defining five architectures under the acronym "RAID" (for Redundant Arrays of Inexpensive Disks).

A RAID 1 architecture involves providing a duplicate set of "mirror" storage units and keeping a duplicate copy of all data on each pair of storage units. While such a solution solves the reliability problem, it doubles the cost of storage. A number of implementations of RAID I architectures have been made, in particular by Tandem Corporation.

A RAID 2 architecture stores each bit of each word of data, plus Error Detection and Correction (EDC) bits for each word, on separate disk drives. For example, Flora et al. U.S. Pat. No. 4,722,085 discloses a disk drive memory using a plurality of relatively small, independently operating disk subsystems to function as a large, high capacity disk drive having an unusually high fault tolerance and a very high data transfer bandwidth. A data organizer adds 7 EDC bits (determined using the well-known Hamming code) to each 32-bit data word to provide error detection and error correction capability. The resultant 39-bit word is written, one bit per disk drive, on to 39 disk drives. If one of the 39 disk drives fails, the remaining 38 bits of each stored 39-bit word can be used to reconstruct each 32-bit data word on a word-by-word basis as each data word is read from the disk drives, thereby obtaining fault tolerance.

A RAID 3 architecture is based on the concept that each disk drive storage unit has internal means for detecting a fault or data error. Therefore, it is not necessary to store extra information to detect the location of an error; a simpler form of parity-based error correction can thus be used. In this approach, the contents of all storage units subject to failure are "Exclusive OR'd" (XOR'd) to generate parity information. The resulting parity information is stored in a single redundant storage unit. If a storage unit fails, the data on that unit can be reconstructed onto a replacement storage unit by XOR'ing the data from the remaining storage units with the parity information. Such an arrangement has the advantage over the mirrored disk RAID 1 architecture in that only one additional storage unit is required for "N" storage units. A further aspect of the RAID 3 architecture is that the disk drives are operated in a coupled manner, similar to a RAID 2 system, and a single disk drive is designated as the parity unit. One implementation of a RAID 3 architecture is the Micropolis Corporation Parallel Drive Array, Model 1804 SCSI, that uses four parallel, synchronized disk drives and one redundant parity drive. The failure of one of the four data disk drives can be remedied by the use of the parity bits stored on the parity disk drive. Another example of a RAID 3 system is described in Ouchi U.S. Pat. No. 4,092,732.

A RAID 4 architecture uses the same parity error correction concept of the RAID 3 architecture, but improves on the performance of a RAID 3 system with respect to random reading of small files by "uncoupling" the operation of the individual disk drive actuators, and reading and writing a larger minimum amount of data (typically, a disk sector) to each disk (this is also known as block striping). A further aspect of the RAID 4 architecture is that a single storage unit is designated as the parity unit.

A RAID 5 architecture uses the, same parity error correction concept of the RAID 4 architecture and independent actuators, but improves on the writing performance of a RAID 4 system by distributing the data and parity information across all of the available disk drives. Typically, "N+1" storage units in a set (also known as a "redundancy group") are divided into a plurality of equally sized address areas referred to as blocks. Each storage unit generally contains the same number of blocks. Blocks from each storage unit in a redundancy group having the same unit address ranges are referred to as "stripes". Each stripe has N blocks of data, plus one parity block on one storage unit containing parity for the remainder of the stripe. Further stripes each have a parity block, the parity blocks being distributed on different storage units. Parity updating activity associated with every modification of data in a redundancy group is therefore distributed over the different storage units. No single unit is burdened with all of the parity update activity. For example, in a RAID 5 system comprising 5 disk drives, the parity information for the first stripe of blocks may be written to the fifth drive; the parity information for the second stripe of blocks may be written to the fourth drive; the parity information for the third stripe of blocks may be written to the third drive; etc. The parity block for succeeding stripes typically "precesses" around the disk drives in a helical pattern (although other patterns may be used). Thus, no single disk drive is used for storing the parity information as in the RAID 4 architecture. An example of a RAID 5 system is described in Clark et al. U.S. Pat. No. 4,761,785. RAID 3, 4, and 5 disk storage array configurations provide a lower cost alternative to RAID 1 and 2 configurations. However, RAID 3, 4, and 5 systems that have been optimized for performance are very susceptible to data and/or parity information corruption if a WRITE operation fails before completion because of a component failure. In such systems, it is desirable to have the update of the parity information occur simultaneously with the update of the data, rather than serially, to save time. Thus, if a temporary "failure" (such as a power loss or controller failure) occurs to a storage unit during a WRITE operation, there is no assurance that the data or the corresponding parity information were properly written and valid. Since two concurrent I/O operations are undertaken to update the data and its associated parity, it is difficult to determine which I/O operation was completed before the system termination. Thus, the data that was being written could be corrupted.

The term "Atomic Write" is used in the art to define a WRITE operation to a data storage unit in which the operation, once initiated, (1) invariably completes with data being reliably written to the data storage unit, or (2) positively indicates that the data was not written, thus allowing for complete recovery from the operation, so that data is never lost regardless of the failure of any component or subsystem during the operation.

Tandem Computers Incorporated has for some time provided Atomic Writes for RAID 1 type mirrored data storage units in its line of fault-tolerant computers. However, ensuring write data integrity and redundancy integrity in RAID 3, 4, and 5 disk storage array systems presents a challenge that has not been fully resolved in the art. In particular, a complete system that ensures Atomic Writes in RAID 3, 4, and 5 disk storage arrays has not been described in the art.

Therefore, a need exists for a system architecture which ensures that WRITE operations complete and valid redundancy information is generated in a RAID 3, 4, or 5 system even in the event of a component failure. It is also desirable to have such a RAID system in which restoration of potentially corrupted redundancy information can be conducted with minimum impact on normal processing operations.

The present invention provides a system and method for accomplishing these objectives.

SUMMARY OF THE INVENTION

The present invention provides a system and method for ensuring that data modification operations complete and that valid redundancy information is generated in a RAID 3, 4, or 5 system even in the event of a component failure. The invention also provides a system in which restoration of potentially corrupted redundancy information can be conducted with minimum impact on normal processing operations.

The inventive system combines four elements to achieve Atomic Writes:

(1) reliable host processing provided by primary and secondary CPU's with check pointing of operations, so that the secondary CPU can complete initiation of a data modification operation if the primary CPU fails;

(2) block-buffering of Write data in a host CPU adapter before transmission of the data to a RAID array controller, so that failure of the host CPU after buffering completes does not interfere with completion of the data modification operation;

(3) reliable array processing provided by primary and secondary array controllers with check pointing of operations, so that the secondary array controller can complete a data modification operation if the primary array controller fails;

(4) (a) battery-backup for the power supply to the array controller and the storage units comprising the storage array, or, (b) in the alternative, non-volatile memory in the array controller sufficient to store all data modification operation command information (e.g., data address information and record lengths) for data records that have not been successfully written to the storage units, for use in subsequent retries.

The details of the preferred embodiments of the present invention are set forth in the accompanying drawings and the description below. Once the details of the invention are known, numerous additional innovations and changes will become obvious to one skilled in the art.

BRIEF DESCRIPTION OF THE DRAWINGS

Like reference numbers and designations in the drawings refer to like elements.

DETAILED DESCRIPTION OF THE INVENTION

Throughout this description, the preferred embodiment and examples shown should be considered as exemplars, rather than limitations on the system and method of the present invention.

Figure 1:
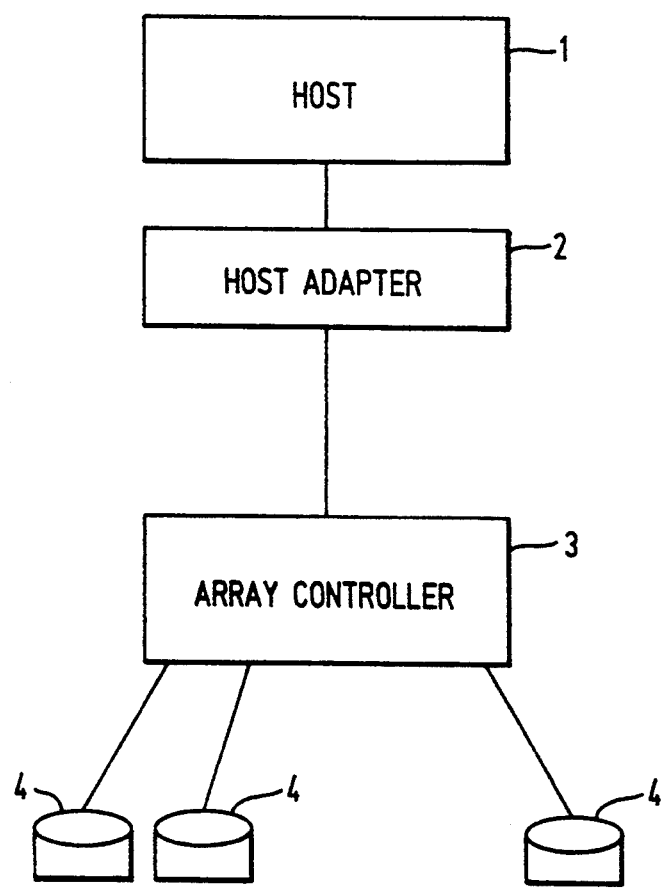
FIG. 1 is a block diagram of a generalized prior art computer system having a RAID data storage system.

FIG. 1 is a block diagram of a generalized prior art computer system having a RAID data storage system. Shown are a host CPU 1 coupled through a host I/O adapter 2 to an array controller 3. The array controller 3 is coupled to each of a plurality of storage units 4 by I/O busses (e.g., SCSI busses). The array controller 3 acts independently of the host CPU 1 to control the storage units 4. A further description of such a system may be found in Clark et al. U.S. Pat. No. 4,761,785.

A data modification, or WRITE, operation comprises moving a data record, along with address information, from the memory of the host CPU 1, through the host I/O adapter 2 and the array controller 3, and then recording the data record on one or more data storage units 4 in accordance with the address information. For RAID 3, 4, and 5 data storage systems, a corresponding redundancy record (usually comprising parity information) must be updated by the array controller 3 to maintain redundancy consistency for the data protected by the redundancy record. Only then is the WRITE operation complete.

A problem presented by such an architecture is that it has a multiplicity of "single points of failure"—components with no redundancy or fault-tolerance. The failure of any one component during a WRITE operation will result in a failure to complete the operation at best, and corruption of data and/or redundancy information at worst. In a modern RAID system, several WRITE operations can be "stacked" (i.e., concurrently pending), and thus several data records and redundancy records may be corrupted when such WRITE operations are interrupted.

The problem to be solved is ensuring that the data record as well as the redundancy record are valid and coherent after a WRITE operation despite failures of any one of the host CPU 1, host I/O adapter 2, array controller 3, or storage units 4. (Although multiple contemporaneous failures could occur in theory, the probability of such happening is remote. However, in applications where utmost fault-tolerance is required, an additional level of redundancy for all components may be implemented, in known fashion.)

Figure 2:
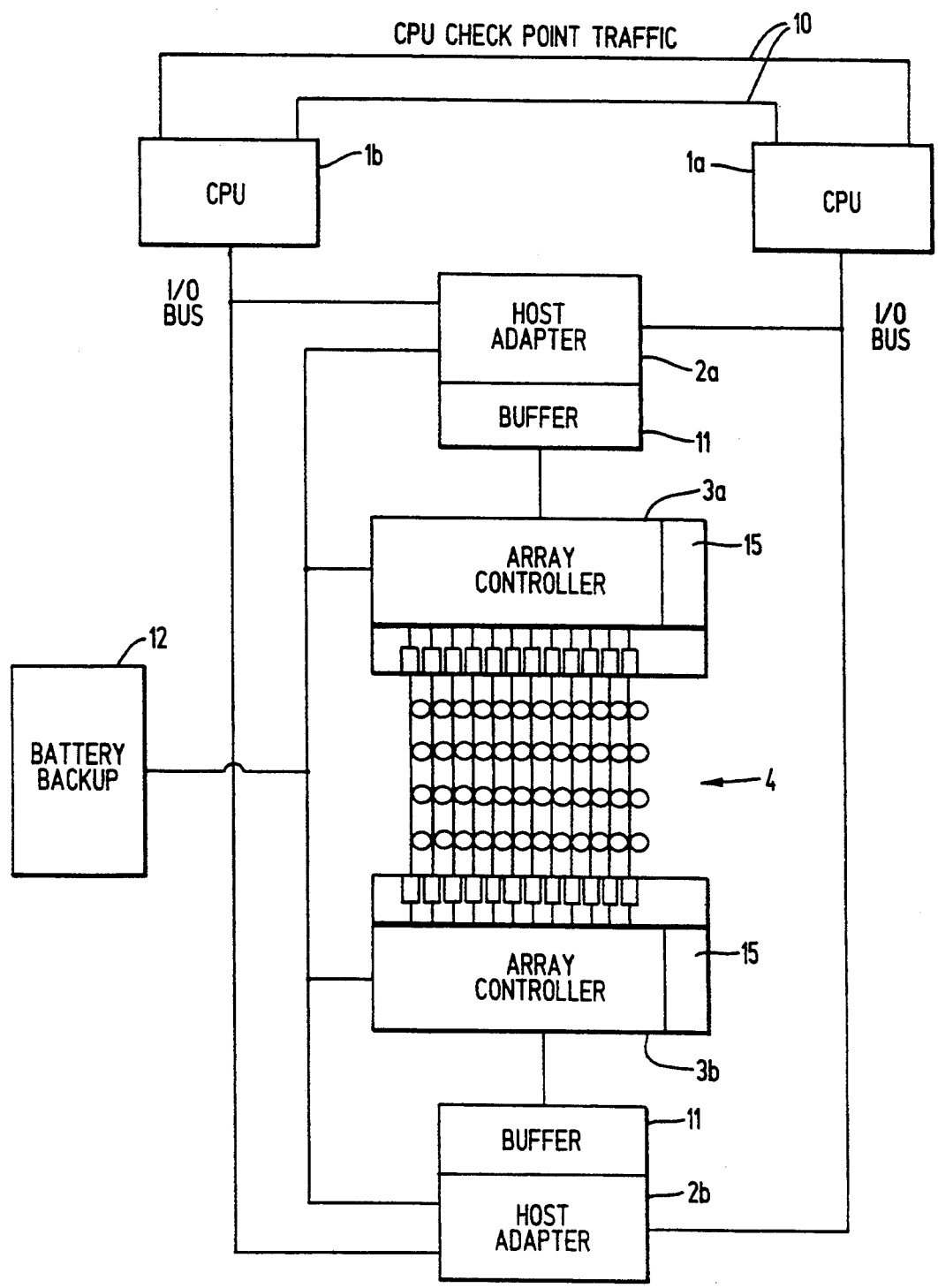
FIG. 2 is a block diagram of a fault-tolerant computer system having a RAID system in accordance with the present invention.

FIG. 2 is a block diagram of a preferred embodiment of a fault-tolerant computer system having a RAID system in accordance with the present invention. A primary CPU 1a and secondary CPU 1b are coupled by an interprocessor bus 10. Both CPU's 1a, 1b are coupled to a pair of host adapters 2a, 2b, each of which is coupled to an array controller 3a, 3b. Each array controller 3a, 3b is coupled by a plurality of I/O busses to a plurality of data storage units 4 such that each data storage unit 4 is coupled to both array controllers 3a, 3b. In an alternative embodiment the functions of the host adaptors 2a, 2b are physically combined into the corresponding array controllers 3a, 3b. The principals of the invention remain unchanged, since the functions of both elements are still required.

The inventive system combines four elements to achieve Atomic Writes:

(1) Reliable Host Processing. Reliable host processing is provided by the primary and secondary CPU's 1a, 1b with check pointing of operations, so that the secondary CPU 1b can complete initiation of a WRITE operation if the primary CPU 1a fails. Such check pointing of operations can be done in a number of known ways, but basically involves executing the same processes on both CPU's 1a, 1b, with status information being periodically communicated between the CPU's 1a, 1b for comparison. In particular, such check point information is communicated before each WRITE operation and after each WRITE operation, thus assuring that each CPU has a record of the current operational state of the system.

If the primary CPU 1a fails, the secondary CPU 1b continues in operation, using the check point information to determine the last status of any pending WRITE operations and then completing those WRITE operations. Thus, if a WRITE operation was commenced by the primary CPU 1a, check point information relating to that operation is transmitted to the secondary CPU 1b. The check point information may comprise either the pertinent data record (the "WRITE image") and address information, pointer information (e.g., to a common fault-tolerant memory) to the data record and address information, or change records indicating what portions of the secondary CPU's 1b data record must be changed to conform to the data record in the primary CPU 1a.

If the WRITE operation completes, check point information to that effect is transmitted to the secondary CPU 1b by the primary CPU 1a. If the primary CPU 1a fails before completion of the WRITE operation, the secondary CPU 1b can either monitor the host I/O adapters 2a, 2b for acknowledgement of completion, or use the check point information to re-initiate the WRITE operation from the beginning.

(2) Block-buffering of WRITE Data. If "before" and "after" WRITE images plus interim change records for a data record are communicated between the primary CPU 1a and the secondary CPU 1b, the secondary CPU 1b may readily recover any uncompleted WRITE operations if the primary CPU 1a fails. However, communicating complete WRITE images imposes an operational overhead on each CPU 1a, 1b, thereby reducing the available processing capacity of the system. It is therefore more efficient for normal operation to communicate only change records between the CPU's 1a, 1b. This is called partial block check pointing, and is an efficient way of reducing the processing overhead of a fault-tolerant computer system.

Partial block check pointing poses a problem for ensuring Atomic Writes if the primary CPU 1a fails in the midst of transferring a modified data record to be written to the host adapters 2a 2b and writing of the modified data record to the storage units 4 has commenced. If the original data record has been only partially updated on the storage units 4 with the information in the modified data record, the secondary CPU 1b cannot apply the check point change record to the original data record, in order to create the modified data record, because the secondary CPU 1b does not have an uncorrupted original data record on which to work.

The invention resolves this problem while still maintaining the efficiencies of partial block check pointing by providing a data buffer 11 in each host I/O adaptor 2a, 2b sufficient in size to buffer a desired number of WRITE data records, and requiring that a complete data record and its corresponding address information be buffered in the host I/O adapters 2a, 2b before either host I/O adaptor 2a, 2b begins transmission of the data record to the array controllers 3a, 3b. If the primary CPU 1a fails before a data block is fully transferred to a host I/O adaptor 2a, 2b, no new data record is written to the storage units 4, and the data on the storage units 4 remains uncorrupted. The secondary CPU 1b can then apply the relevant check point change records to the original, uncorrupted data read back from the storage units 4, and write the re-generated data records to the storage units 4. If the primary CPU 1a fails after a data record is completely transferred to a host I/O adaptor 2a, 2b, the host I/O adapters 2a, 2b and the array controllers 3a, 3b have all the information necessary to complete the WRITE operation without further intervention by the primary CPU 1a.

(3) Reliable Array Processing. Reliable array processing is provided by the primary and secondary array controllers 3a, 3b with check pointing of operations, so that the secondary array controller 3b can complete a WRITE operation if the primary array controller 3a fails. As in the case of check pointing the CPU's 1a, 1b, such check pointing of operations can be done in a number of known ways, but basically involves executing the same processes on both array controllers 3a, 3b with status information being communicated between the array controllers 3a, 3b for comparison. In particular, such check point information is communicated before each WRITE operation and after each WRITE operation, thus assuring that each array controller 3a, 3b has a record of the current operational state of the storage subsystem.

In the case of the array controllers 3a, 3b, complete WRITE images from the host CPU's 1a, 1b can be efficiently communicated to the array controllers 3a, 3b over the I/O busses, since the array controllers 3a, 3b can "listen" to I/O bus communication in parallel. Check point change records reflecting the status of WRITE operations by the primary array controller 3a are transmitted by the primary controller 3a to the secondary array controller 3b. If the primary array controller 3a fails, the secondary array controller 3b continues in operation, using the check point information to determine the last status of any pending WRITE operations and then completing those WRITE operations.

In an alternative embodiment, each array controller 3a, 3b is coupled to each of the storage units 4 over common busses, the secondary controller 3b can monitor the busses to determine the status of operations undertaken by the primary controller 3a. Through such monitoring, the secondary controller 3b can deduce what WRITE operations have been initiated, and which WRITE operations have been completed. If the primary array controller 3a fails, the secondary array controller 3b simply takes over operation of the storage units 4 and completes all pending WRITE operations.

(4a) Battery-Backup for the Storage System Power Supply. If power to both array controllers 3a, 3b and the storage units 4 fails before a WRITE operation is completed, redundancy data stored in the storage units 4 might not properly reflect the true redundancy information necessary for the redundancy groups of the data records being written when the power failed. In the perfect situation, writing of all data and redundancy records to the storage units 4 just completes before the power fails. However, more likely one of the following cases will occur: (1) the data record and/or the redundancy record are partially written and have garbled information; (2) the data record is completely written but not the redundancy record; or (3) the redundancy record is completely written but not the data record.

Further, when power is restored, the host CPU's 1a, 1b normally have no information on the precise address locations the array controllers 3a, 3b were working on before the power failure. Although case (1) may be detected by the storage units 4 through use of internal error correction codes (ECC) or cyclic redundancy check (CRC) codes, and corrected by the host CPU through a retry and error recovery operation, generally a host CPU cannot correct for cases (2) or (3) through such operations.

One method to verify and correct the redundancy information is to check all of the storage units 4 for redundancy record consistency (e.g., by re-computing the redundancy records for all redundancy groups in the storage units 4) at every power-up of the system. Detection of an inconsistency indicates the address of the data records that were not properly written. The CPU's 1a, 1b can then re-execute the previous WRITE operation for such data records. However, this is very time consuming when large capacity storage units are used, as is common with RAID systems. Moreover, the storage array would not be available for the system at every power-up, delaying system boot time if the CPU's 1a, 1b depend on the storage units 4 to store boot code.

One solution to the problem of power failure to the array controllers 3a, 3b and the storage units 4 that is provided by the present invention is the use of a battery backup system 12 to supply power to the storage subsystem. The battery backup system 12 provides a "graceful" power-fail shutdown period that allows pending WRITE operations in the storage subsystem to complete.

In the preferred embodiment, the battery, backup system 12 is an uninterruptable power supply (UPS) system that constantly provides power to the storage subsystem, and is kept charged from an external power source. Alternatively, a switching power supply (SPS) may be used that monitors the primary external power source and automatically switches into the power circuit if the primary external power source fails. Both UPS's and SPS's are well-known in the art.

(4b) Non-Volatile Memory for WRITE Operations. One drawback of using the battery backup system 12 is that the cost and size of the backup system 12 increases with the number of storage units 4 supported. An alternative solution provided by the present invention is the use of a non-volatile memory in the array controllers 3a, 3b sufficient in capacity to store all WRITE command information (e.g., data address information and record lengths) for data records that have not been successfully written to the storage units 4, for use in subsequent retries.

Figure 3:
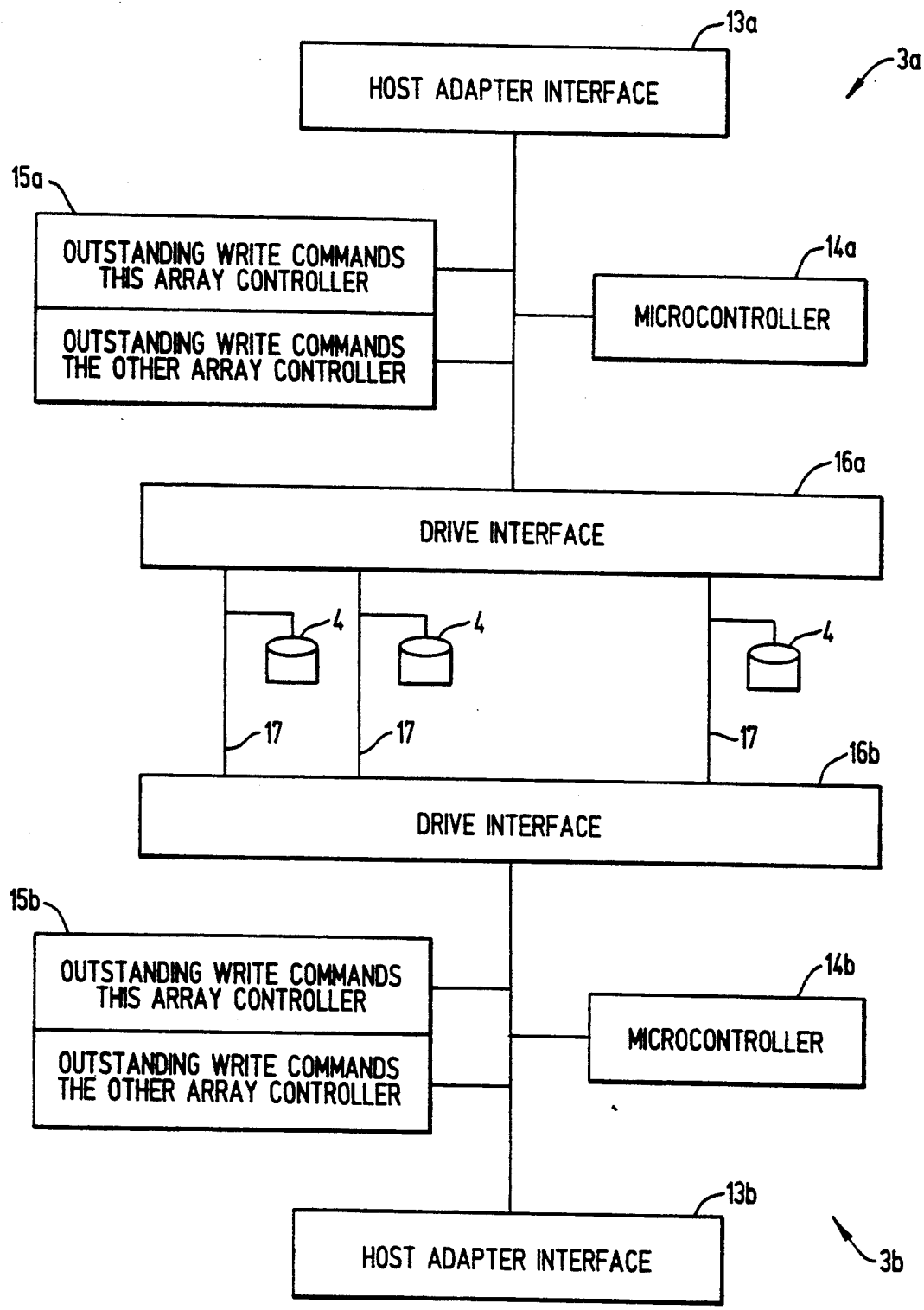
FIG. 3 is a block diagram of a RAID data storage subsystem having a non-volatile memory for WRITE commands, in accordance with the present invention.

FIG. 3 is a block diagram of a RAID data storage subsystem in accordance with the present invention. Each array controller 3a, 3b comprises respectively a host adapter interface 13a, 13b, a microcontroller 14a, 14b, a non-volatile Write Command Buffer 15a, 15b for outstanding WRITE commands for both array controllers 3a, 3b, and a drive interface 16a, 16b. Each drive interface 16a, 16b is coupled by standard busses 17 (e.g., SCSI busses) to a plurality of storage units 4.

The Write Command Buffers 15a, 15b can be configured from, for example, 16 KB non-volatile static random-access memories (SRAM's). Suitable SRAM's are Part No. DS1220Y, manufactured by Dallas Semiconductor.

The normal operation of the subsystem is as follows: when the microcontrollers 14a, 14b receive a WRITE operation from a host CPU 1a, 1b via the corresponding host adapter interface 13a, 13b, the respective microcontroller 14a, 14b stores an image of the WRITE command, including the location and length of the data record being modified, in its corresponding Write Command Buffer 15a, 15b. As each WRITE operation completes (i.e., both the data record and corresponding redundancy record are written to the storage units 4), each microcontroller 14a, 14b updates its corresponding non-volatile Write Command Buffer 15a, 15b to effectively remove the WRITE command image therein corresponding to the written data record. Each non-volatile Write Command Buffer 15a, 15b can queue a number of WRITE commands in sequence. If all pending WRITE commands complete, the non-volatile Write Command Buffers 15a, 15b will be effectively empty.

If a power failure occurs in both array controllers 3a, 3b or in the storage units 4, the recovery process is as follows: at power-up, the primary microcontroller 14a reads its non-volatile Write Command Buffer 15a to determine if any WRITE commands were pending before the power failure. If not, then normal processing resumes. If so, then the microcontroller 14a performs a redundancy consistency check for those locations in the storage units 4 indicated by the WRITE command information in the non-volatile Write Command Buffer 15a. The redundancy consistency check is performed by reading all corresponding data records in the redundancy group stripe indicated by a pending WRITE command, calculating a new redundancy record based on the data records read (e.g., by XOR'ing all of the data records), and writing the new redundancy record to the redundancy storage unit for that redundancy group. This procedure ensures that the redundancy information on the storage units 4 is valid.

If a data record was only partially written when the power failure occurred, the data record will not generate a proper CRC code when read. The primary microcontroller 14a marks (directly or indirectly) each of these data records with an error flag, writes a known pattern in the date record (e.g., all 1's, with an invalid CRC code), generates correct redundancy information for the corresponding redundancy group stripe based on this known pattern, and indicates to the CPU's 1a, 1b that the data record is in error.

After the redundancy records have been validated, the CPU's 1a, 1b may then retry all previously unfinished WRITE operations, which will correct all data records marked as being in error, and bring the data records on the storage units 4 up to date.

Since the number of unfinished WRITE operations is normally small compared to the amount of data stored in the storage units 4, validating the redundancy records and retrying the WRITE operations for all interrupted WRITE commands is significantly faster than validating all of the redundancy records in the entire storage system. Titus, the non-volatile Write Command Buffer 15a provides a significant speed advantage over the prior art.

If the primary microcontroller 14a fails, the secondary microcontroller 14b takes over operation of the storage units 4 and uses the information in its corresponding Write Command Buffer 15b to determine the status of unfinished WRITE commands. Recovery would proceed as described above.

A number of embodiments of the present invention have been described. Nevertheless, it will be understood that various modifications may be made without departing from the spirit and scope of the invention. For example, the present invention can be used with RAID 3, 4, or 5 systems. Furthermore, an error-correction method in addition to or in lieu of XOR-generated parity may be used for the necessary redundancy information. One such method using Reed-Solomon codes is disclosed in U.S. Pat. No. 5,148,432, issued Aug. 15, 1992, entitled "Arrayed Disk Drive System and Method". Accordingly, it is to be understood that the invention is not to be limited by the specific illustrated embodiment, but only by the scope of the appended claims.

We claim:

1. A system for ensuring the completion and integrity of data modification operations to a redundant data storage array subsystem, comprising:
   a. a first host processor configured to initiate data modification operations for data records and to generate host check point information about said data modification operations;
   b. a second host processor, coupled to the first host processor, to receive the host check point information and assume control of initiated data modification operations if the first host processor fails;
   c. first and second buffers, coupled to the first and second host processors, each buffer having sufficient capacity for receiving and storing entire generated data modification operations from the first or second host processor, whereby subsequent failure of either host processor does not affect the received data modification operations;
   d. a redundant array of data storage devices coupled to both the first and second buffers for storing data records as indicated by said data modification operations originating from either host processor;
   e. a first array processor, coupled to the first buffer and to the redundant array of data storage devices to receive data modification operations transmitted to the controller from the first buffer, the array processor being configured to control the completion of the data modification operations to the redundant array of data storage devices, and to generate array check point information about said data modification operations; and
   f. a second array processor, coupled to the second buffer, to the redundant array of data storage devices, and to the first array processor, the second array processor being configured to receive data modification operations from the second buffer, the array check point information generated by the first array processor, and to assume control of the completion of the data modification operations to the redundant array of data storage devices if the first array processor fails.

2. The system of claim 1, further including a battery backup, coupled to the first and second array processors, and to the redundant array of data storage devices, for supplying electrical power to the first and second array processors and the redundant array of data storage devices if the primary power supply thereto fails.

3. The system of claim 1, wherein the redundant array of data storage devices is arranged in a RAID 3 configuration.

4. The system of claim 1, wherein the redundant array of data storage devices is arranged in a RAID 4 configuration.

5. The system of claim 1, wherein the redundant array of data storage devices is arranged in a RAID 5 configuration.

6. The system of claim 1, wherein each array processor further includes non-volatile storage for storing selected information about each data modification operation until such data modification operation is completed.

7. The system of claim 6, wherein the stored information is used to validate redundancy records, in the redundant array of data storage devices, for uncompleted data modification operations after a power loss to the redundant array of data storage devices.

8. The system of claim 7, wherein the stored information is communicated to one of the host processors, and wherein the receiving host processor includes means for re-initiating uncompleted data modification operations.

9. A method for ensuring the completion and integrity of data modification operations to a redundant data storage array subsystem, comprising the steps of:
   a. providing a first host processor for initiating data modification operations for data records and for generating host check point information about said data modification operations;

b. providing a second host processor, coupled to the first host processor to receive the host check point information, and for assuming control of initiated data modification operations if the first host processor fails;

c. providing first and second buffers, coupled to the first and second host processors, to receive and store entire generated data modification operations from the first or second host processor, whereby subsequent failure of either host processor does not affect the received data modification operations;

d. providing a redundant array of data storage devices for storing data records as indicated by said data modification operations;

e. providing a first array processor, coupled to the first buffer and to the redundant array of data storage devices, for receiving data modification operations from the first buffer, for controlling the completion of the data modification operations to the redundant array of data storage devices, and for generating array check point information about said data modification operations; and f. providing a second array processor, coupled to the second buffer, to the redundant array of data storage devices, and to the first array processor, for receiving data modification operations from the second buffer, for receiving the array check point information from the first array processor, and for assuming control of the completion of the data modification operations to the array of data storage devices if the first array processor fails.

10. The method of claim 9, further including the step of providing a battery backup, coupled to the first and second array processors, and to the redundant array of storage devices, for supplying electrical power to the first and second array processors and the redundant array of data storage devices if the primary power supply thereto fails.

11. The method of claim 9, further including the step of storing selected information about each data modification operation in a non-volatile storage component until such data modification operation is completed.

12. The method of claim 11, further including the step of using the stored information to validate redundancy records, in the redundant array of data storage devices, for uncompleted data modification operations after a power loss to the redundant array of data storage devices.

13. The method of claim 12, further including the step of communicating the stored information to one of the host processors, and using the stored information in such host processor to re-initiate uncompleted data modification operations.

14. A method for ensuring the completion and integrity of data modification operations to a redundant storage array subsystem, comprising the steps of:

a. initiating data modification operations for data records in a first host processor, and generating host check point information about said data modification operations;

b. receiving the host check point information in a second host processor, and assuming control by the second host processor of initiated data modification operations if the first host processor fails;

c. receiving and storing the entire data modification operations in first and second buffers, whereby subsequent failure of either host processor does not affect the received data modification operations;

d. receiving data modification operations from the first buffer in a first array processor, the first array processor controlling completion of the data modification operations to a redundant array of data storage devices and generating array check point information about said data modification operations; and e. receiving the data modification operations from the second buffer and the array check point information from the first array processor in a second array processor, the second array processor assuming control of the completion of the data modification operations to the redundant array of data storage devices if the first array processor fails.

15. The method of claim 14, further including the step of supplying electrical power to the first and second array processors and the redundant array of data storage devices from a battery backup system if the primary power supply thereto fails.

16. The method of claim 14, wherein the first array processor controls completion of the data modification operations to a RAID 3 configuration of redundant data storage devices.

17. The method of claim 14, wherein the first array processor controls completion of the data modification operations to a RAID 4 configuration of redundant data storage devices.

18. The method of claim 14, wherein the first array processor controls completion of the data modification operations to a RAID 5 configuration of redundant data storage devices.

19. The method of claim 14, further including the step of storing selected information about each data modification operation in a non-volatile storage component until such data modification operation is completed.

20. The method of claim 19, further including the step of using the stored information to validate redundancy records, in the redundant array of data storage devices, for uncompleted data modification operations after a power loss to the redundant array of data storage devices.

21. The method of claim 20, further including the step of re-initiating uncompleted data modification operations indicated by the stored information.

* * * * *